United States Patent [19]

Hamby

[11] Patent Number: 4,715,928
[45] Date of Patent: Dec. 29, 1987

[54] FLEXIBLE PRINTED CIRCUITS AND METHODS OF FABRICATING AND FORMING PLATED THRU-HOLES THEREIN

[76] Inventor: Bill L. Hamby, 1198 Navigator Dr., Ventura, Calif. 93003

[21] Appl. No.: 909,315

[22] Filed: Sep. 19, 1986

Related U.S. Application Data

[62] Division of Ser. No. 780,806, Sep. 27, 1985, Pat. No. 4,687,695.

[51] Int. Cl.[4] .......................... C23F 1/02; B44C 1/22; C03C 15/00; C03C 25/06
[52] U.S. Cl. ........................................ 156/630; 29/846; 29/852; 156/150; 156/629; 156/634; 156/645; 156/656; 156/659.1; 156/902
[58] Field of Search .................. 428/137–140, 428/192, 901; 29/846, 852; 174/68.5; 361/397, 398, 401, 402, 414; 204/15, 24, 38.4; 427/96, 97; 156/150, 151, 629, 630, 632, 633, 634, 645, 656, 659.1, 666, 901, 902

[56] References Cited

U.S. PATENT DOCUMENTS

| | | | |
|---|---|---|---|
| 4,037,047 | 7/1977 | Taylor | 156/629 X |
| 4,085,502 | 4/1978 | Ostman et al. | 154/634 X |
| 4,626,462 | 12/1986 | Kober | 156/630 X |

Primary Examiner—William A. Powell
Attorney, Agent, or Firm—Blakely, Sokoloff, Taylor & Zafman

[57] ABSTRACT

Flexible printed circuits and methods of fabricating and forming plated thru-holes therein are disclosed. The flexible printed circuits have one or more substantially rigid regions where plated thru-holes are to be formed, the regions being made rigid by the substitution of epoxy glass or other conventional rigid printed circuit board materials in place of the flexible material used for the flexible portions of the circuit. In this manner the thru-holes are formed through conventional printed circuit board layers, allowing plating of the thru-holes using conventional well developed techniques. This process avoids the necessity of plating thru-holes in flexible printed circuit materials currently requiring special equipment and techniques, and further avoids stress concentration at the junction between the rigid plated thru-holes and the adjacent flexible printed circuit. Various methods for forming such circuits and circuits so formed are disclosed.

15 Claims, 16 Drawing Figures

FLEXIBLE PRINTED CIRCUITS AND METHODS OF FABRICATING AND FORMING PLATED THRU-HOLES THEREIN

This is a divisional of application Ser. No. 780,806, filed Sept. 27, 1985, now U.S. Pat. No. 4,687,695

BACKGROUND OF THE INVENTION

1. Field of the Invention

The present invention relates to the field of flexible printed circuits.

2. Prior Art

Flexible printed circuits are now well known and are finding increased application in various types of products. Such circuits provide excellent flexibility and fatigue life, being ideal for applications where flexing throughout the service life of the circuit is a functional requirement, as well as applications where flexing is a requirement primarily to facilitate assembly and disassembly, to accommodate dimensional variations, etc. By way of example, flexible printed circuits formed in a rolling loop are commonly used for coupling printhead drive signals to the reciprocating printhead of dot matrix and other types of printers. Typical applications where flexibility is primarily required to facilitate assembly and disassembly include the use of the flexible printed circuit in place of a wire harness, as a flexible printed circuit provides the same function with reduced weight, greater flexibility and greater reliability, and with controlled and repeatable coupling between lines, an important consideration whenever signals which may include high frequency components are to be coupled through the circuit.

Conventional flexible printed circuit materials include as the flexible plastic film Kapton, Nomex and Teflon (trademarks of DuPont). These materials provide excellent flexibility, stability and heat resistance, and are now readily bondable to copper sheets for the formation of the printed circuit, and to themselves to provide an insulating layer for the printed circuit and/or to facilitate the construction of multilayer boards. These materials however, are very difficult to plate, and accordingly present special problems when one attempts to form interconnects between layers of the printed circuit. In particular, in conventional printed circuit board fabrication, interconnects between layers are generally formed by drilling thru-holes through pads of the layers to be interconnected, and of course all substrates aligned therewith, providing a flash of electroless plating through the thru-hole, and then electroplating through the thru-hole to provide the interconnect. The flexible printed circuit materials however, cannot be electroless plated without special preparation of the material, which of course must be done after the thru-hole is drilled, as it is the fresh material exposed by the drilling operation which must be plated. Accordingly, the formation of plated thru-holes in flexible printed circuits is an expensive, time-consuming operation, generally requiring special equipment and skills. In addition, because this technology is relatively new, it is not nearly as well developed as is the formation of plated thru-holes in conventional printed circuit boards, and therefore the results are sometimes less than desired in spite of the special processing used.

As an alternative to the use of plated thru-holes in flexible printed circuits, eyelets are sometimes used whereby the eyelets are inserted through the drilled thru-holes and flared, the eyelets making electrical contact to the exposed copper at each side of the board, the integrity of which contact is assured by soldering each side of the eyelet to the associated printed circuit. While the use of the eyelet eliminates the problem of forming plated thru-holes, insertion and flaring of the eyelets is itself a time-consuming process, and of course connection to any intermediate printed circuit layers in a multilayer flexible printed circuit can only be achieved through the use of eyelets by removing all layers thereabove at some stage of the manufacturing proces prior to insertion of the eyelet and flaring and soldering thereof. At best, eyelets also tend to be relatively large in comparison to printed circuit line widths, etc. of circuits made in flexible form, and both eyelets and plated thru-holes have the disadvantage of creating a local rigid spot in an otherwise flexible sheet, tending to concentrate stresses during flexing of the circuit at the junction between the rigid spot and the adjacent flexible circuit.

U.S. Pat. No. 4,338,149 discloses a process for making circuit boards having rigid and flexible areas. The resulting circuit is comprised of the thin flexible layers in both the flexible and rigid portions of the circuit, the rigid portions being made rigid by additional rigid layers bonded thereto. Thus any thru-holes through the rigid portions necessarily pass through the flexible layers (e.g., flexible materials bonded as part of the sandwich) and accordingly the same interconnect problem exists as heretofore discussed.

In U.S. Pat. No. 4,318,954, printed wiring board substrates for ceramic chip carriers are disclosed. The problem addressed by that invention is the differential thermal expansion between conventional printed circuit boards and ceramic chip carriers. In order to reduce the coefficient of thermal expansion in the plane of the circuit board, a graphite reinforced support member is sandwiched between board layers to constrain the expansion rate of the sandwich in the plane of the circuit board. Because the graphite reinforced support member is electrically conductive, it is necessary to insulate the support member from a plated thru-hole. This is accomplished by drilling an oversized hole in the support member and filling the perimeter of the hole with an electrically nonconductive filler, such as an epoxy washer or any other suitable insulating substances having a low coefficient of thermal expansion. Other low expansion reinforcements such as aramid fibers do not require a nonconductive filler. The nonconductive filler of course, is for electrical insulation purposes only, with the entire circuit formed by the process being rigid.

BRIEF SUMMARY OF THE INVENTION

Flexible printed circuits and methods of fabricating and forming plated thru-holes therein are disclosed. The flexible printed circuits have one or more substantially rigid regions where plated thru-holes are to be formed, the regions being made rigid by the substitution of epoxy glass or other conventional rigid printed circuit board materials in place of the flexible material used for the flexible portions of the circuit. In this manner the thru-holes are formed through conventional printed circuit board layers, allowing plating of the thru-holes using conventional well developed techniques. This process avoids the necessity of plating thru-holes in flexible printed circuit materials currently requiring special equipment and techniques, and further avoids stress concentration at the junction between the rigid plated thru-holes and the adjacent flexible printed circuit. Various methods for forming such circuits and circuits so formed are disclosed.

DETAILED DESCRIPTION OF THE INVENTION

Figure 1:
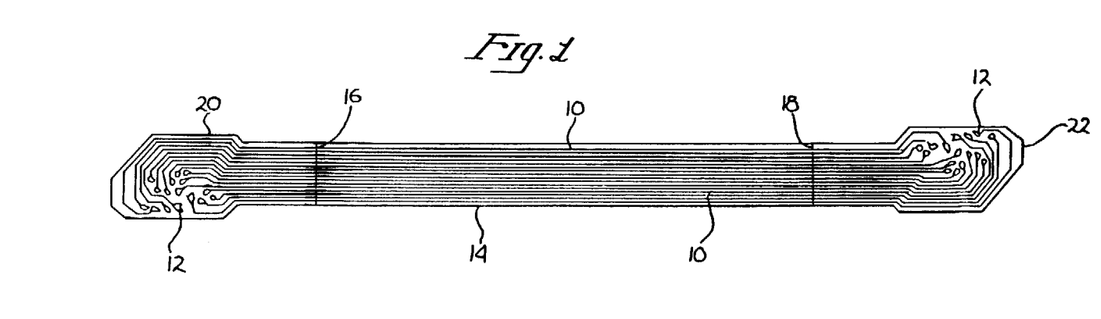
FIG. 1 is a face view of an exemplary flexible printed circuit fabricated in accordance with the present invention.

First referring to FIG. 1, a face view of an exemplary flexible printed circuit fabricated in accordance with the present invention may be seen. The printed circuit is comprised of a plurality of individual electrical conductors each extending between a respective pair of terminal pads 12 at opposite ends of the printed circuits, the pads 12 typically having plated thruholes therethrough for soldering to connector pins or the like. The essential feature of the present invention illustrated in FIG. 1 is that the central region 14 between lines 16 and 18 is flexible, having all the characteristics and advantages of prior art flexible circuits, with the end regions 20 and 22 being rigid and formed of conventional printed circuit board materials. The advantage of this, of course, is that because the rigid portions are formed of conventional materials, conventional manufacturing techniques may be applied to the fabrication and/or finishing of these regions. Of particular importance is the ability to form plated thru-holes in these regions, such as through pads 12, to provide solder connections to the circuit component onto which the printed circuit is to be connected, and to also form plated thru-holes at other regions of the rigid printed circuit to provide cross-overs and/or interconnections between printed circuit layers in multilayer printed circuit boards.

As an additional advantage of the present invention, the rigidifying of the portions of the printed circuit to be connected to other components relieves stresses which otherwise may exist around one or more such connections. In particular, if the entire printed circuit is flexible, including those regions in which solder connections are to be made to rigid terminals, any twisting or flexing of the printed circuit will tend to concentrate the stresses arising therefrom on the closest solder connection, as the rigidity of that connection coupled with the flexibility of the circuit extending to other connections essentially prevents the communication of the load to the rest of the terminals. By rigidifying the ends (or other regions) of the flexible printed circuit where connections are to be made, the load caused by flexing or twisting of the printed circuit will be much better distributed overall, such connection thereby substantially reducing the maximum stress at any such connection. Of course, there must always be some junction between the rigid portions and the flexible portions, whether that is a very small rigid area comprising a solder pad, or a rigid area comprising an entire printed circuit region. In an embodiment such as that illustrated in FIG. 1, junctions 16 and 18 between the rigid areas and the flexible area are straight rather than curved, thereby tending to well distribute the stress of bending, twisting etc. over the entire junction, though any such junctions may be curved, even circular, depending upon the needs of any particular application, as the strength and flexibility of the materials used assures excellent strength and durability of the junction regardless of its shape.

A typical flexible printed circuit will have various layers therein having a thickness on the order of a few thousandths of an inch, will have conductive path line widths on the order of tens of thousandths of an inch, and lengths on the order of inches or even feet. Accordingly, in the remaining Figures, printed circuit patterns, cross-sections and the like are drawn out of scale for purposes of clarity so as to better illustrate the method of fabrication of the printed circuits and various features thereof. Thus, as may be seen in FIG. 2, a cross-section of a single layer flexible printed circuit in accordance with the present invention, such as the type illustrated in FIG. 1, may be seen. This exemplary cross-section illustrates a single conductor 24 extending between the two ends of the structure. The conductor 24 is sandwiched between flexible printed circuit layers 26 and 28 in the central section thereof, and between conventional rigid printed circuit board material members 30 and 32 at the ends thereof.

Figure 2:
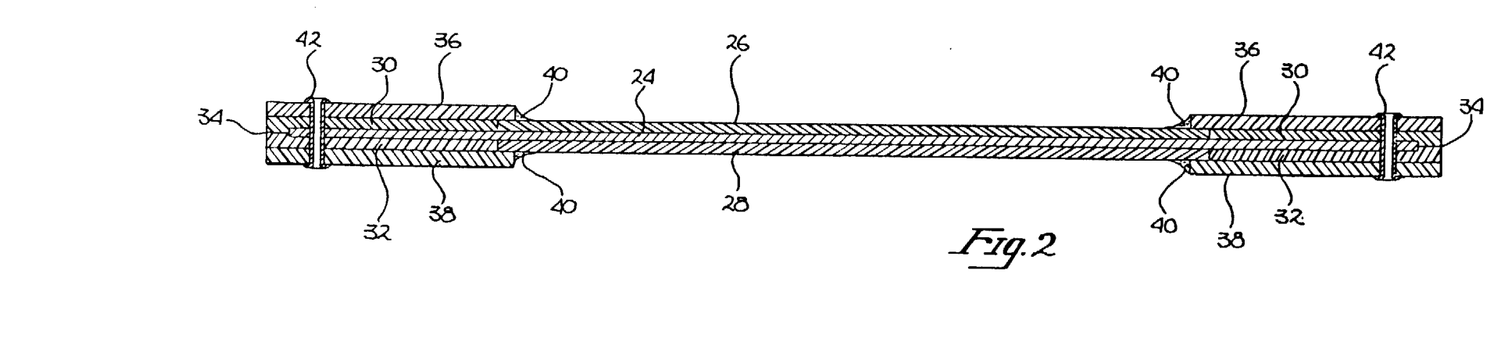
FIG. 2 is a schematic cross section of a flexible printed circuit of the same general type as illustrated in FIG. 1.
Figure 3:
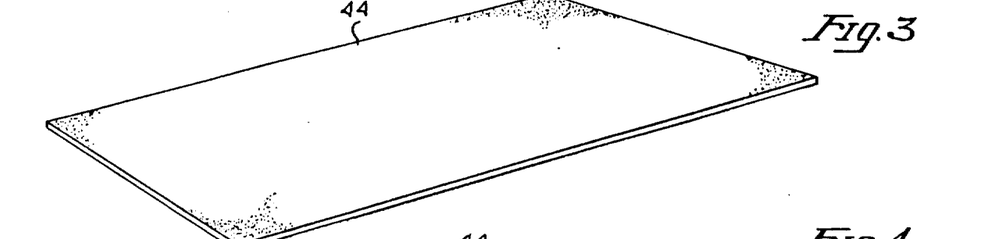
FIGS. 3–12 are views illustrating the various steps in the preferred process for fabricating a flexible printed circuit in accordance with FIGS. 1 and 2.
Figures 4, 5:
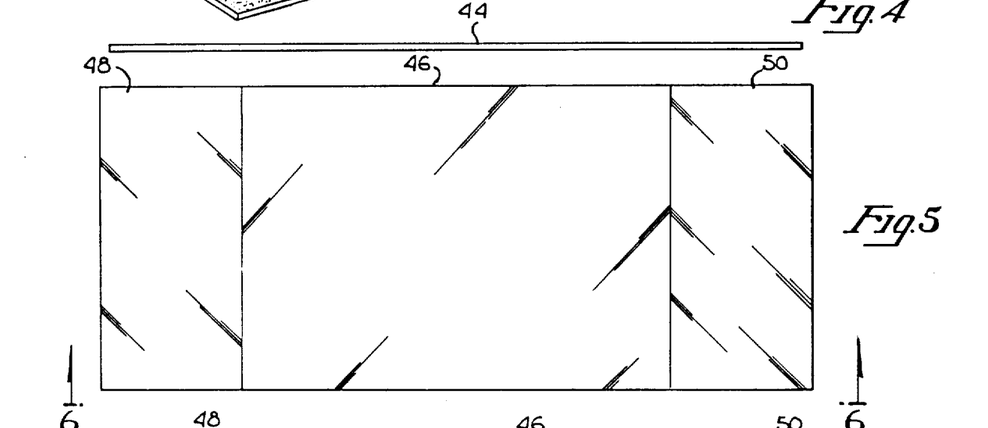

The flexible printed circuit board material for layers 26 and 28 may be by way of example, Kapton, although other flexible printed circuit materials may also be used as desired. The conventional rigid printed circuit board materials for regions 30 and 32 may also be any conventional rigid printed circuit board material, the preferred embodiment being a prepreg epoxy board comprising a stage B epoxy impregnated fiberglass printed circuit board substrate, used because of its ease of use, final rigidity and dimensional stability in the finished product. Structurally, the epoxy board layers 30 and 32 fuse to the adjacent ends of the flexible members 26 and 28, respectively, with the layers fusing to each other at the ends of 34 of the assembly. Laminated over layers 30 and 32 are additional layers of epoxy board 36 and 38, the inner edges of which preferably overlap the junction between flexible layers 26 and 28 and the epoxy board layers 30 and 32, respectively, to provide reinforcement for the junction therebetween. If desired an additional stress relieving filler 40 of a similar flexible resin or other material may be used as a further stress relief between the rigid portion and the flexible portion of the finished circuit.

It may be seen from FIG. 2 that when a plated thruhole 42 is made, the plated thru-hole extends through multilayers of the assembly, all of which are comprised of conventional printed circuit board materials, specifically either epoxy board or the copper circuit itself. As such, the plated thru-hole 42 may be readily formed by drilling, providing a thin electroless copper plating in the thru-holes, and then electroplating thereover to provide the required copper buildup. As a result, the plated thru-holes may readily be formed using conventional printed circuit board fabrication techniques without the difficulties associated with the plating of flexible printed circuit materials, and without having to use any of the special processes required thereby.

Figures 6, 7:
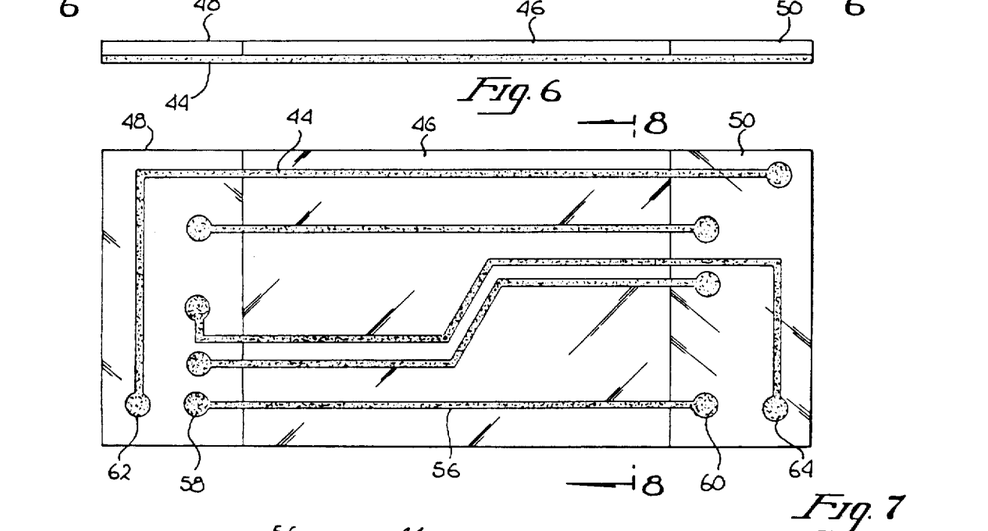

The preferred method of fabricating printed circuits in accordance with the present invention is illustrated in FIGS. 3 through 12. Initially, a thin sheet of copper 44 having a size preferably somewhat larger than the finished printed circuit is provided. A piece of appropriate flexible material, Kapton precoated with an adhesive in the exemplary embodiment, is appropriately cut to span the desired flexible region of the finished circuit. This Kapton layer (FIGS. 5 and 6) is placed over the copper sheet 44, with epoxy glass prepreg members 48 and 50 being placed over the adjacent end portions of the copper sheet 44 so as to abut or substantially abut the Kapton layer 46. The resulting structure shown in FIG. 6 is then heated in a press so that the Kapton layer, precoated with an appropriate adhesive (commercially available in that form) bonds to the copper sheet, as does the epoxy glass portions. Further, prior to curing, the epoxy resin in the glass will adequately flow to provide a good bond to the edges of the Kapton, so that all members of the assembly which abut each other are bonded to each other over the respective areas of abutment. In that regard, while the edge bond between the epoxy glass regions 48 and 50 and the Kapton region 46 is not generally a high strength edge bond, it does have sufficient strength to retain the members to each other throughout the remainder of the processing steps.

Figure 8:
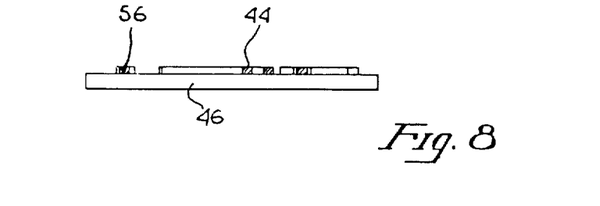
Figure 9:
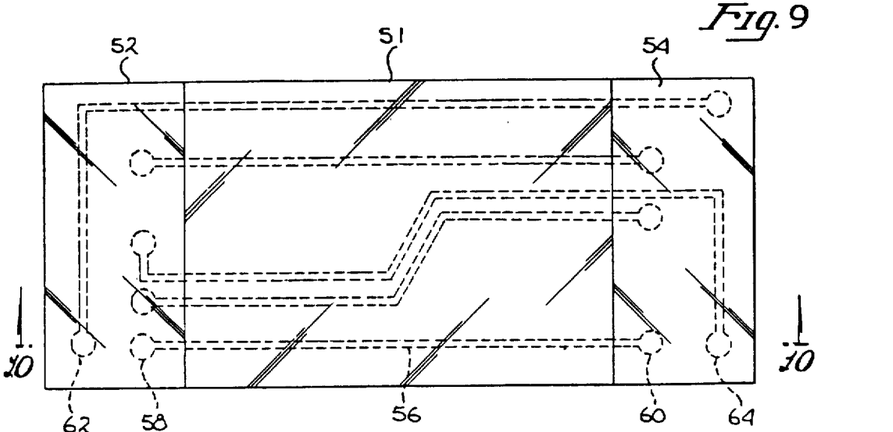

The next step in the process is to etch the copper sheet 44 so as to leave the desired copper pattern as illustrated in FIGS. 7 and 8. In general, this step is accomplished in the same manner as is used in forming conventional printed circuit boards, specifically, by coating the copper layer with appropriate photo resist, exposing the photo resist and developing the photo resist. Thereafter the exposed or alternatively unexposed photo resist is dissolved away, depending upon the type of photo resist used, and the exposed areas of the copper etched away to leave the copper pattern as shown. Finally, the remaining photo resist is dissolved away.

Thereafter, the exposed copper pattern is itself covered with another layer of Kapton 51 and epoxy board 52 and 54 as shown in FIGS. 9 and 10, and again heated in a press to form the sandwich structure shown. As may be seen in these Figures, copper conductors such a conductor 56 extend to the center of the two layers of Kapton between pads 58 and 60, with additional conductors connecting other pads, such as by way of example pads 62 and 64, all of which are buried pads, buried between the two layers of epoxy board. If desired, the junction between the flexible members and the adjacent epoxy board members may be staggered to help to provide additional strength to the structure of FIGS. 9 and 10. In the preferred embodiment, additional layers of epoxy board 66, 68, 70 and 72 (FIGS. 11 and 12) are laminated over the structure of FIGS. 10 and 11, either as part of the same lamination step just described, or alternatively as a separate lamination step. As may be seen in FIG. 12, these layers 66, 68, 70 and 72 are preferably staggered with respect to the junction between the flexible layers and the edgewise adjacent epoxy board layers so as to themselves provide both greater rigidity to the end regions and to stress relieve the edge joint between the flexible regions and the edgewise adjacent epoxy boards. Finally in FIG. 12, the plated thru-holes 74, 76, 78 and 80 making electrical contact to the buried copper pads 62, 68, 60 and 64, respectively, are drilled and plated as hereinbefore described. In a typical assembly, the various layers are aligned by appropriate reference marks falling outside the area of the finished flexible printed circuit assembly, with the reference marks being removed when the final assembly is trimmed to size.

Figure 10:
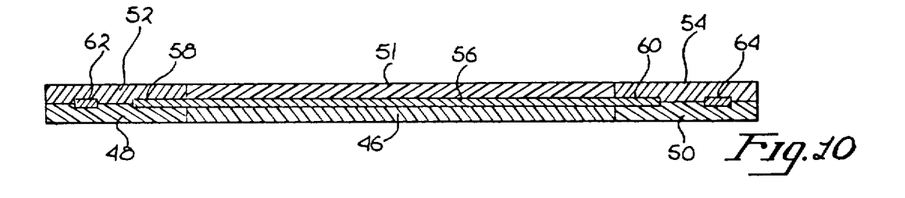
Figure 11:
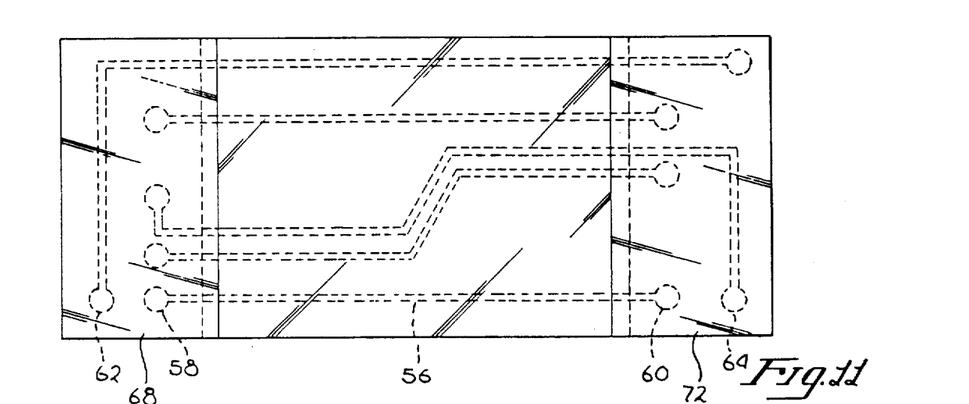
Figure 12:
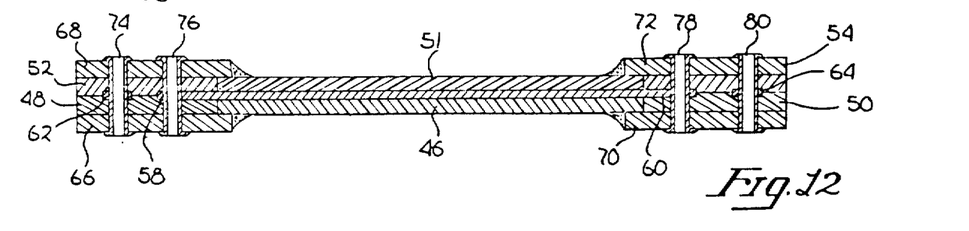
Figure 13:
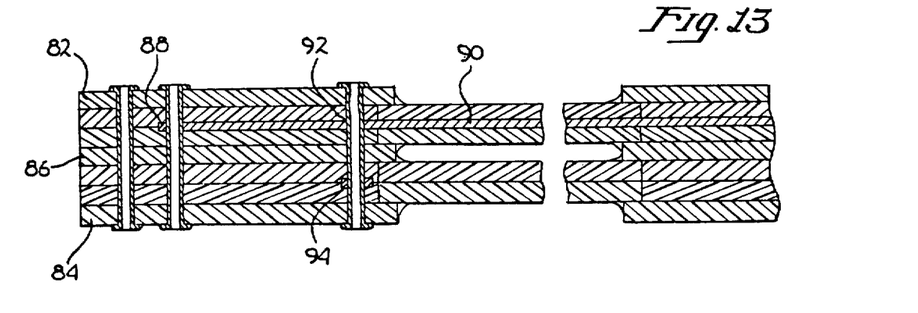
FIG. 13 is a cross section of a portion of a multilayer flexible printed circuit fabricated in accordance with the present invention and taken along the line 13—13 of FIG. 16.
Figures 15, 16:
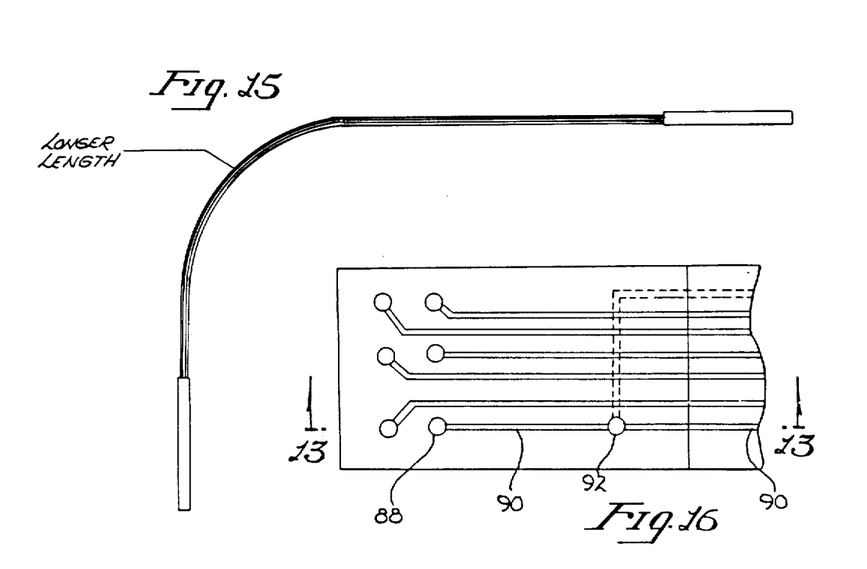
FIG. 15 is a view illustrating the use of the present invention in an application having a fixed and static offset between the two ends thereof.
FIG. 16 is a face view of a multilayer flexible printed circuit illustrating the application of the concepts of the present invention to the formation of interconnects and crossovers in a multilayer flexible printed circuit assembly.

Now referring to FIGS. 13 and 16, additional aspects and features of the present invention may be seen. In particular, FIG. 16 presents a top view of a multilayer flexible printed circuit, the same circuit being shown in cross-section in FIG. 13. In the preferred multilayer form, two or more structures generally similar to that illustrated with respect to FIG. 10 are laminated together with outer layers 82 and 84 of epoxy board, as well as being separated by intermediate layer or layers 86, also of epoxy board, so that as before the rigid portions are formed entirely of conventional printed circuit board materials. (In some applications, the intermediate layers 86 will not be used, particularly in a circuit having many layers, to avoid unnecessary thickness accumulation in the rigid areas.) Also as illustrated in FIG. 13, preferably each flexible printed circuit region comprising a sandwich of the printed circuit with a layer of flexible material on each side thereof is not bonded to the adjacent sandwich, thereby maintaining maximum flexibility of the flexible portions of the finished assembly. (Obviously, in those applications where very limited flexibility is needed, two or more such layers may be bonded as desired.)

Referring again to FIG. 16, it will be noted conductive pad 88, visable also in FIG. 13, is integrally connected with conductor 90 extending across the flexible portion of the printed circuit. In addition, a second pad 92 is provided which pad allows the interconnecting of that layer of the printed circuit with a pad 94 of a second printed circuit layer therebelow. As may be seen in FIG. 13, to provide this interconnect, a plated thru-hole is provided through pads 92 and 94 to provide electrical connection therebetween. Thus, in flexible printed circuits wherein cross-overs are required, in accordance with the present invention, the circuit is preferably laid out so that the cross-overs may be formed not in the flexible portion or in any rigid portion formed in part by layers of the flexible printed circuit, but rather in the rigid portion as formed entirely of conventional printed circuit board materials, again facilitating the formation of plated thru-holes using conventional processing and yielding high reliability interconnects.

Figure 14:
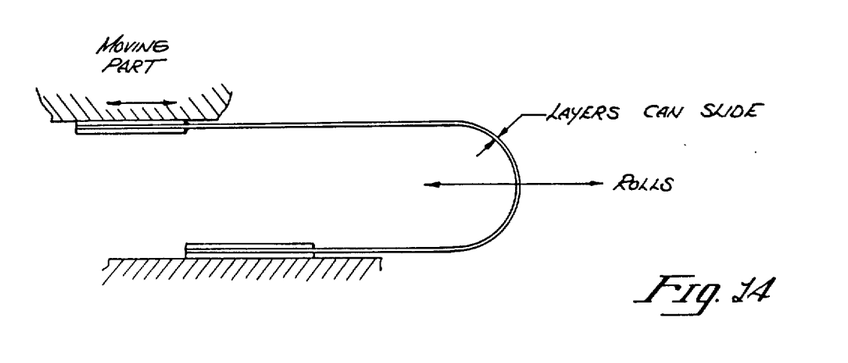
FIG. 14 is a view illustrating the use of the present invention as a rolling loop.

The flexible printed circuit of FIG. 13 is suitable for various applications such as by way of example the formation of rolling loops as illustrated in FIG. 14. Obviously in cases where some rigid portions of the circuit are to be installed at an angle to each other, the various layers in a multilayer flexible printed circuit may have slightly different lengths to accommodate the different radii of curvature in the area of the bend. In that regard, it should be noted that the exemplary printed circuits shown herein show or suggest that the "ends" of the flexible circuits be made rigid, though the word ends as used herein is used in a relative sense in that an flexible printed circuit board assembly may have the rigid regions formed other than that the physical ends of the structure, and in many cases may have more than two rigid regions either connected to a single flexible portion and/or separating flexible portions, as it is not uncommon to use a flexible printed circuit, by way of example, to interconnect with more than two electronic modules in an overall system.

The preferred embodiments of the invention described herein have been described with respect to the use of a copper sheet as one of the starting materials, which of course results in a patterned copper layer or layers for the conductive portion of the printed circuit. While copper is the most common material used for printed circuits in general, it should be noted that other materials may also be used as desired. By way of specific example, one might use nickle instead of copper, as nickle may be readily etched and plated by electroless and electroplating techniques and may have some advantages in specific applications. Also, in addition to other metals and metal alloys, one could also use printed circuit layers formed by thin or thick film techniques. In such a case, by way of example, one might provide adjacent pieces of rigid and flexible material and edge bond these pieces by pressing and heating the pieces. Thereafter a conductive thick film layer could be put down on the resulting sheet by printing through a mask or by silk-screening techniques, and cured to form the structure shown in FIGS. 7 and 8. Techniques for putting down thin film and thick film circuit patterns are well known and need not be described in great detail herein. Of particular importance to the present invention is the fact that many thin film and thick film materials are readily electroplatable and accordingly the processing from the structure of FIGS. 7 and 8 may proceed in the same manner as hereinbefore described. Thus, while the present invention has been disclosed and described herein with respect to certain specific exemplary structures and methods, it will be understood by those skilled in the area that various changes in form and detail may be made therein without departing from the spirit and scope of the invention.

I claim:

1. A method of making flexible printed circuits comprising the steps of
    (a) providing a sheet of metal,
    (b) covering at least a first area of the metal sheet with a sheet of flexible material,
    (c) covering a second area of the metal sheet at least in part coterminous with the first area with a rigid printed circuit board material,
    (d) bonding the flexible material and the rigid material to the metal sheet,
    (e) etching the metal sheet to form a circuit pattern and
    (f) bonding additional flexible material and rigid printed circuit board to the flexible material and rigid printed circuit board material, respectfully, of steps (b) and (c) to sandwich the circuit pattern formed in step (e) therebetween.

2. The method of claim 1 further comprised of the steps of drilling at least one thru-hole through the rigid printed circuit board material and a part of the circuit pattern sandwiched therein and plating the thru-hole to make electrical contact with the circuit pattern.

3. The method of claim 1 wherein additional rigid printed circuit board is bonded to the rigid printed circuit board of claim 14 so as to overlay and reinforce the junction with the adjacent flexible material.

4. The method of claim 3 further comprised of the steps of drilling at least one thru-hole through the rigid printed circuit board material and a part of the circuit pattern sandwiched therein and plating the thru-hole to make electrical contact with the circuit pattern.

5. A method of making multilayer flexible printed circuits comprising the steps of
    (1) forming a plurality of printed circuit elements, each being formed by the steps of
        (a) providing a sheet of metal,
        (b) covering at least a first area of the metal sheet with a sheet of flexible material,
        (c) covering a second area of the metal sheet at least in part coterminous with the first area with a rigid printed circuit board material,
        (d) bonding the flexible material and the rigid material to the metal sheet,
        (e) etching the metal sheet to form a circuit pattern and
        (f) bonding additional flexible material and rigid printed circuit board material to the flexible material and rigid printed circuit board material, respectively, of steps (b) and (c) to sandwich the circuit pattern formed in step (e) therebetween
    (2) bonding the plurality of circuit elements together in a stack through the rigid printed circuit board substrates,
    whereby at least one portion of the multilayer flexible printed circuit does not include any layers of the flexible material therein.

6. The method of claim 15 further comprised of the steps of
    (3) drilling at least one thru-hole through the portion of the multilayer flexible printed circuit which does not include any layers of the flexible material therein and through at least on layer of metal circuit pattern therein, and
    (4) plating the thru-hole to make electrical contact with all layers of the metal circuit pattern through which the thru-hole passes.

7. The method of claim 1 wherein the thru-hole passes through at least two layers of metal circuit pattern, whereby the plating of step (4) electrically interconnects multilayers of th flexible printed circuit.

8. The method of claim 7 wherein in step (2), additional rigid printed circuit board substrates are bonded between the rigid printed circuit board substrates of the circuit elements and on the top and bottom of the stack thereof so as to somewhat overlie the junction between the flexible material and the rigid printed circuit board substrate of the adjacent circuit element, thereby to reinforce the junction.

9. The method of claim 1 wherein in step (2), additional rigid printed circuit board substrates are bonded between the rigid printed circuit board substrates of the circuit elements and on the top and bottom of the stack thereof so as to somewhat overlie the junction between the flexible material and the rigid printed circuit board substrate of the adjacent circuit element, thereby to reinforce the junction.

10. A method of making a flexible printed circuit comprising the steps of:
    providing an electrically conductive layer of material having two sides, a first sheet of flexible electrically insulative material having a first edge, and a first sheet of rigid printed circuit board substrate having an edge;
    positioning said flexible sheet and said rigid sheet on a first side of said electrically conductive layer of material with said edges of said flexible and rigid sheets in abutting relation;

bonding said sheets to said electrically conductive layer of material while maintaining the edges of said sheets in abutting relation; and forming a circuit pattern in said layer of electrically conductive material such that said circuit pattern extends between said flexible and rigid sheets.

11. The method of claim 10 in which said flexible electrically insulative material further has a second edge, said method, prior to forming said circuit pattern in said electrically conductive layer further comprising the steps of:

providing a second sheet of rigid printed circuit board substrate having an edge;

positioning said second rigid sheet on said first side of said electrically conductive lay er of material with said edge of said second rigid sheet and said second edge of said flexible sheet in abutting relation;

bonding said second rigid sheet to said electrically conductive layer of material while maintaining the edges of said second rigid sheet and said flexible sheet in abutting relation;

such that said circuit pattern formed in said conductive layer extends between said flexible sheet and said first and second rigid sheets.

12. The method of claim 10, further comprising the steps of:

providing a second flexible sheet having an edge and a second rigid sheet having an edge;

positioning said second flexible and rigid sheets on a second side of said patterned conductive layer such that said second flexIble and rigid sheets overlay said first flexible and rigid sheets and such that the edges of said second flexible and rigid sheets are in abutting relation and whereby said patterned conductive layer is sandwiched between said first flexible and rigid layers and said second flexible and rigid layers.

13. The method of claim 12, further comprising the steps of drilling at least one thru-hole through said first and second rigid sheets and a part of said circuit pattern sandwiched therebetween and plating the thru-hole to make an electrical contact with the circuit pattern.

14. A method of making multilayer flexible printed circuits comprising the steps of:

(1) forming a plurality of printed circuit elements, each being formed by the steps of:

(a) providing an electrically conductive layer of material having two sides, first and second sheets of flexible electrically insulative material each having an edge, and first and second sheets of rigid printed circuit board substrate each having edges;

(b) positioning said first flexible sheet and said first rigid sheet on a first side of said electrically conductive layer of material with said edge of said first flexible and rigid sheets in abutting relation;

(c) bonding said first sheets to said electrically conductive layer of material while maintaining the edges of said first sheet in abutting relation;

(d) forming circuit pattern in said layer of electrically conductive material such that said circuit pattern extends between said first flexible and rigid shets;

(e) positioning said second flexible and rigid sheets on a second side of said pattern conductive layer such that said second flexible and rigid sheets overlay said first flexible and rigid sheets and such that the edges of said second flexible and rigid sheets are in abutting relation; and (f) bonding said second flexible and rigid sheets to said patterned conductive layer and said first flexible and rigid sheets;

whereby said patterned conductive layer is sandwiched between said first flexible and rigid layers and said second flexible and rigid layers;

(2) arranging said plurality of circuit elements in a multilayer stack such that at least one portion of said multilayer stack does not include any layers of the flexible material therein; and (3) bonding said plurality of circuit elements together through said portion of said stack that does not includes any of the flexible material.

15. The method of claim 14 further comprising the steps of:

(4) drilling at least one thru-hole through said portion of the multilayer flexible printed circuit which does not include any layers of the flexible material therein; and (5) plating the thru-hole to make electrical contact with all layers of the electrically conductive material through which the thru-hole passes.

* * * * *

UNITED STATES PATENT AND TRADEMARK OFFICE
CERTIFICATE OF CORRECTION

PATENT NO. : 4,715,928
DATED : Dec. 29, 1987
INVENTOR(S) : Hamby

It is certified that error appears in the above-identified patent and that said Letters Patent is hereby corrected as shown below:

| COLUMN | LINE | DESCRIPTION |
| --- | --- | --- |
| 8 | 29 | delete "15" and insert --5-- |
| 8 | 43 | delete "th" and insert --the-- |
| 9 | 18 | delete "lay" "er" and insert "layer" |
| 10 | 19 | delete "shets" and insert "sheets" |

Signed and Sealed this

Fourteenth Day of June, 1988

Attest:

DONALD J. QUIGG

*Attesting Officer*   *Commissioner of Patents and Trademarks*